United States Patent [19]

Stevens et al.

[11] Patent Number: 5,170,242
[45] Date of Patent: Dec. 8, 1992

[54] REACTION BARRIER FOR A MULTILAYER STRUCTURE IN AN INTEGRATED CIRCUIT

[75] Inventors: E. Henry Stevens, Colorado Springs, Colo.; Masahiro Maekawa, Tateyama, Japan

[73] Assignees: Ramtron Corporation, Colorado Springs, Colo.; NMB Semiconductor Company, Ltd., Japan

[21] Appl. No.: 698,841

[22] Filed: May 10, 1991

Related U.S. Application Data

[63] Continuation of Ser. No. 445,233, Dec. 4, 1989, abandoned.

[51] Int. Cl.⁵ .................................................. H01L 29/48
[52] U.S. Cl. ........................................ 257/751; 257/757; 257/617
[58] Field of Search .................. 357/15, 61, 67, 71, 357/88, 91

[56] References Cited

U.S. PATENT DOCUMENTS

| | | | |
|---|---|---|---|
| 4,180,546 | 12/1979 | Crowder et al. | 357/71 |
| 4,784,973 | 11/1988 | Stevens et al. | 437/200 |
| 4,868,633 | 9/1989 | Plumton et al. | 357/71 |
| 4,975,753 | 12/1990 | Ema | 357/71 |
| 4,977,440 | 12/1990 | Stevens | 357/68 |

OTHER PUBLICATIONS

Murarka and Williams, "Dopant Redistribution In Silicide-Silicon and Silicide-Polycrystalline Silicon Bilayered Structures", *J. Vac. Sci. Technol.* B5(6), Nov./Dec. 1987, pp. 1674–1688.

C. B. Cooper and R. A. Powell, "The Use of Rapid Thermal Processing To Control Dopant Redistribution During Formation Of Tantalum and Molybdenum Silcide/N+ Polysilicon Bilayers", *IEEE Electronic Device Letters*, vol. EDL-6, May, 1985, p. 234.

*Primary Examiner*—Edward J. Wojciechowicz
*Attorney, Agent, or Firm*—Edward D. Manzo; Mark J. Murphy; Michael B. Johannesen

[57] ABSTRACT

A reaction barrier is formed at an interface region between adjacent layers of a multilayer composite integrated circuit by implanting one or more active ionic species at energies effective to place the ionic species at or near the interface. A further step may include annealing the structure formed above to promote efficacy of the reaction barrier.

28 Claims, 1 Drawing Sheet

REACTION BARRIER FOR A MULTILAYER STRUCTURE IN AN INTEGRATED CIRCUIT

This is a continuation of application Ser. No. 07/445,233, filed Dec. 4, 1989, now abandoned.

FIELD OF THE INVENTION

This invention is generally related to integrated circuit fabrication, and, more specifically, to the fabrication of a reaction barrier in a multilayer structure in an integrated circuit.

BACKGROUND OF THE INVENTION

In the fabrication of multilayer composite structures in integrated circuits, it is often necessary to use isolation or barrier layers to minimize reactions of elements in two adjacent layers. To this end, multilayer structures sometimes include an isolation layer of a material selected because it does not react with the two layers it is separating.

An example of this would be forming a multilayer composite structure where a metal silicide may be used over a semiconductor substrate. An example of this multilayer composite structure would be in the fabrication of a pass transistor in an MOS dynamic random access memory. A first layer may be, for example, a source-drain region fabricated in or on a doped semiconductor substrate, and a second layer may be an electrical interconnect layer made of a metal silicide which facilitates electrical connection between the source-drain region and a metal conductor layer.

It has been found that the metal component (and, to a lesser extent, the silicon component) of the metal silicide tends to attract the dopant away from the interface region between the metal silicide and the substrate thus leaving the area of the substrate adjacent to the interface dopant depleted. The dopant tends to form compounds with the metal component of the silicide along the interface and/or at the grain boundaries in the metal silicide adjacent to the interface. This depleted region in the substrate can cause the performance of the semiconductor device to degrade, or possibly become dysfunctional. Furthermore, an unwanted compound layer can exhibit low electrical conductivity, which can also have these deleterious effects. The article by Murarka and Williams, "Dopant Redistribution In Silicide-Silicon And Silicide Polycrystalline Silicon Bilayered Structures", *J. Vac. Sci. Technol.* B5(6), Nov./Dec., 1987, pp. 1674–1688 (and references cited therein) describes this phenomenon.

Another article by C. B. Cooper and R. A. Powell, "The Use Of Rapid Thermal Processing To Control Dopant Redistribution During Formation Of Tantalum And Molybdenum Silicide/N+ Polysilicon Bilayers", *IEEE Electronic Device Letters,* Vol. EDL-6, May, 1985, p. 234, describes one method of dealing with dopant redistribution. There it is proposed to control dopant redistribution by rapid thermal processing. While this method can minimize the diffusion of dopants, it cannot eliminate the redistribution of dopants over a distance range of 0.001 to 0.01 microns adjacent to the metal silicide-semiconductor interface.

U.S. Pat. No. 4,784,973 to Stevens et al. for Semiconductor Contact Silicide/Nitride Process with Control for Silicide Thickness discloses a process for forming a control layer between contact openings and transistor terminal regions in an integrated circuit. According to a first aspect of the invention, a thin control layer preferably comprising a compound of silicon, oxygen and nitrogen is formed by a thermal treatment. A layer of transition metal is then deposited over the contact region, and reacted during another thermal treatment to form a compound of, for example, titanium, silicon, oxygen and nitrogen. The control layer is believed to retard the rate of diffusion of silicon into the titanium, thus preventing undesirable "spikes" and resultant transistor failure.

A second aspect of the invention disclosed in U.S. Pat. No. 4,784,973 includes depositing a layer of a transition metal, such as titanium, over the above-described structure, and thermally reacting this structure in a nitridating environment, thus substantially converting this layer into titanium nitride. The layer thus formed acts as a barrier to silicon diffusion during subsequent thermal cycles.

While the reaction barrier formed according to U.S. Pat. No. 4,784,973 is effective in retarding silicon movement, this barrier has only limited effectiveness in retarding the movement of dopants, such as boron, from silicon into adjacent metal silicides. Furthermore, formation of a reaction barrier according to the disclosure of U.S. Pat. No. 4,784,973 requires the addition of special depositions and thermal cycles to the typical sequence of semiconductor processing. Thus, this reaction barrier does not provide an entirely satisfactory means for retarding unwanted movement of dopants.

Therefore, it is an object of this invention to provide a reaction barrier which minimizes the problems caused by unwanted dopant movements in semiconductor devices.

It is a further object of this invention to provide a reaction barrier that does not require the deposition of an additional layer of material.

SUMMARY OF THE INVENTION

This invention provides a method for forming a reaction barrier adjacent to an interface between two layers, illustratively a lower layer and a layer thereover (an upper layer), in a multilayer composite integrated circuit. One or more active ionic species is implanted at energies calculated to place the ionic species preferably in the upper layer but at or near the interface, thus forming a reaction barrier at or near the interface. Additionally, a further step of annealing the structure formed through implantation is provided, to further promote efficacy of the reaction barrier.

In a specific embodiment, in a multilayer structure including a doped semiconductor substrate with a metal silicide over-layer, boron is implanted near the interface within the metal silicide layer, followed by an implantation of nitrogen. Additionally, the reaction barrier thus formed may be annealed in a nitrogen-containing atmosphere.

DETAILED DESCRIPTION OF THE PREFERRED EMBODIMENT

Figure 1:
FIG. 1 is a basic or usual prior art structure.

FIG. 1 is an illustration of a general multiple layer composite structure as is known in the art. FIG. 1 includes a doped silicon layer 12 with a metal silicide layer 14 (typically 0.1 to 0.3 microns thick) deposited over the doped silicon layer 12. As will be described in more detail below, the doped substrate could be mono or poly crystalline silicon, as is known in art, doped with, for example, boron, arsenic or phosphorus. The metal silicide layer 14 could be titanium silicide, tungsten silicide, cobalt silicide, nickel silicide, molybdenum silicide, tantalum silicide or any refractory or transition metal compounded with silicon. A low-resistance composite structure is thus formed, as is known in the art. An interface region 16 is defined by the area where the metal silicide and substrate layers meet.

As described above, it is believed that the dopant in the silicon layer 12 near the interface region 16 will be attracted to or tends to migrate towards the metal silicide adjacent to the interface region 16, as indicated by arrows 17. The silicon layer 12 becomes depleted of dopant near the interface region, and as a result may not operate reliably. In addition, a low-electrical-conductivity layer of metal silicide-dopant compounds (for example, $Ti_wSi_xB_y$) may form in the metal silicide layer 14 adjacent to the interface region 16. Because this low-conductivity layer is not formed in a controlled, predictable manner, the layer may have a range of effects, from none at all to complete electrical insulation of the metal silicide layer 14 from the silicon layer 12.

Figure 2:
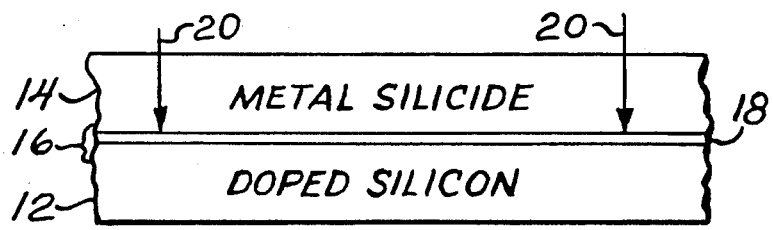
FIG. 2 illustrates a barrier region formed by the process according to this invention.

Turning now to FIG. 2, an illustration of the formation of a reaction barrier 18 according to this invention is shown. Reaction barrier 18 is generally formed by implanting one or more high energy ionic species at or near the interface region 16. After deposition of the metal silicide layer, the ionic species are implanted through the upper surface of region 14 at energies calculated to implant the highest concentration of ions in the lower parts of metal silicide layer 14, and more particularly within approximately 0.001 to 0.01 microns on the metal silicide layer 14 side of interface region 16. In one embodiment of this invention, the ions implanted may be boron and nitrogen. The order of implantation is not critical to this embodiment of this invention. Arrows 20 indicate the implantation, which can occur using well-known equipment. Finally, the structure thus formed may be annealed in a controlled atmosphere as is known in the art in order to improve the performance of the barrier region.

Implanting ionic species at or near the interface region 16 forms a thin reaction barrier 18 on the metal silicide side of and adjacent to the interface region 16. Desirably, the reaction barrier 18 may be 0.001 to 0.01 microns thick. By implanting ionic species in the metal silicide layer 14 adjacent to the interface region 16, a controlled and therefore predictable reaction occurs in the metal silicide 14 to form the reaction barrier 18 adjacent to the interface region 16. It is believed that layer 18 forms in the metal silicide adjacent to the interface region because the metal silicide atomic bonds are disrupted or incomplete along the interface region. It is believed compound formation rates should be much higher adjacent to the interface region than either in the interior of the metal silicide or the interior of the silicon layers. It is further believed that the implantation of ions plugs the grain boundaries, that is, forms compounds with the dangling bonds of the metal silicide along grain boundaries, thus preventing the migration or siphoning of the dopant from the silicon layer into grain boundaries within the metal silicide. The controlled reaction of the method according to this invention produces a thin reaction barrier 18 of the chemical composition, for example, $Ti_wSi_xB_yN_z$ (assuming that the metal silicide is titanium silicide, and the implanted atomic species are boron and nitrogen). If the conductivity of layer 18 should be low, the relative thinness of this compound layer permits current flow by way of tunneling, as is known in the art. Therefore, an effective reaction barrier is formed efficiently and with a minimum of additional processing steps.

To increase the efficacy of the reaction barrier 18, the structure may be annealed at approximately 700° C. to 1000° C. in a controlled atmosphere. Annealing may take place in a diffusion furnace as is known in the art, or in a rapid thermal processor wherein heat is supplied by high-intensity infrared lamps. Also, an infrared or optical wavelength laser may be used to stimulate the reaction.

The atmosphere may be, for example, a nitrogen-containing atmosphere which augments the reaction barrier. It is believed that annealing in a nitrogen or ammonia atmosphere forms further nitride compounds in different regions of the composite structure than would be formed by implantation alone. It is believed that the dangling bonds in the grain boundaries and interface layer react with the nitrogen and form nitride compounds. These compounds, as known in the art, passivate or stabilize the metal silicide along the interface region 16 and along grain boundaries within the metal silicide region 14.

Figure 3:
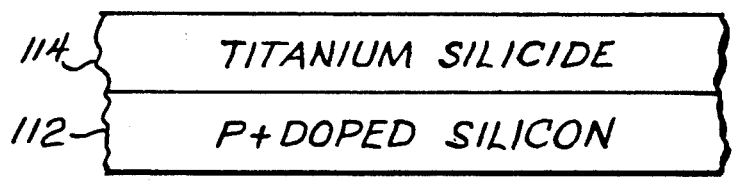
FIG. 3 is a specific embodiment of a prior art structure.
Figure 4:
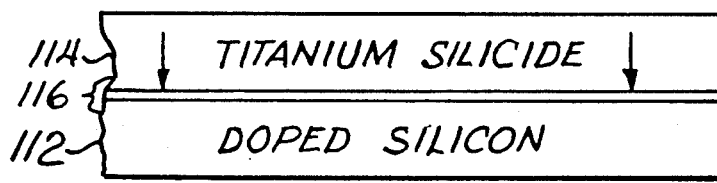
FIG. 4 is an illustration of a specific embodiment of a barrier region formed by the process of this invention.

Turning now to FIGS. 3 and 4, a preferred embodiment of a process for establishing a reaction barrier in a multilayer integrated circuit structure is shown. This method is shown in connection with a dynamic random access memory (DRAM), but this method may be employed in the manufacture of other types of integrated circuits. In FIG. 3, a conductive polysilicon layer 112 is formed by means as are known in the art. The polysilicon layer 112 in this embodiment may be heavily doped with boron to provide a dopant concentration on the order of $10^{18}$ to $10^{20}$ per cubic centimeter (a heavily doped P+ type silicon). Alternatively, the polysilicon layer 112 may also be heavily doped with phosphorus or arsenic to provide a dopant concentration on the order of $10^{18}$ to $10^{20}$ per cubic centimeter (a heavily doped N+ type silicon). A P+ or N+ doped monocrystalline silicon may also be used for the layer 112.

On top of doped silicon 112, a titanium silicide layer 114 is deposited or established by means known in the art to approximately 0.1 to 0.3 microns thick. Tungsten silicide, tantalum silicide or a titanium-tungsten silicide may also be used. The structure thus formed in FIG. 3 is representative and may be used in the fabrication of transistor circuits, for example, in a gate electrode or in a contact to a pass transistor in an MOS DRAM structure. The doped layer 112 may be the source-drain region of the pass transistor and the titanium silicide or other metal silicide may be an interconnect layer between the source/drain region of the transistor and a metallic conductor region to facilitate electrical connection, for example.

In FIG. 4, boron is implanted at energies determined to place the boron in the interface region 116 within the titanium silicide 114. That is, the highest concentration of implanted species occurs in the titanium silicide layer 114 but within 0.001 to 0.01 microns of the interface between the titanium silicide layer 114 and doped polysilicon layer 112. A second implantation of nitrogen may follow the implantation of boron, again with energies calculated to place the nitrogen in the region between 0.001 and 0.01 microns of the interface. Compounds such as $Ti_wSi_xB_yN_z$ are thus formed near the interface region 116 of the titanium silicide layer. These compounds provide a reaction barrier 118 which inhibits boron (or other dopant) migration into the titanium silicide, thus inhibiting dopant depletion of the silicon substrate, and formation of unwanted, low-conductivity compounds in the interface region.

The structure of FIG. 4 may additionally be annealed in a nitrogen-containing atmosphere at approximately 700° C. to 1000° C., in this preferred embodiment, to create further compounds in the reaction barrier region 118. Further layers could then be deposited over metal silicide layer 114 as is known in the art. For example, a typical layer over the metal silicide would be a metal conductor region, such as aluminum.

Figure 5:
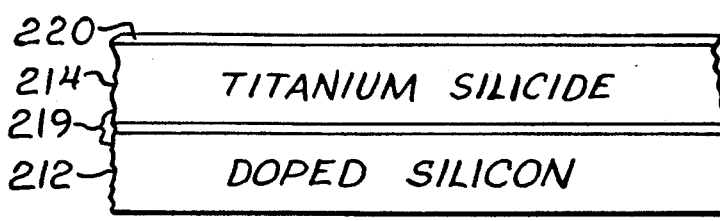
FIG. 5 is an illustration of a second specific embodiment of this invention, showing the formation of multiple barrier regions with one overlayer.

Turning to FIG. 5, a further embodiment of this invention includes a layer or substrate 212, made of monocrystalline or polycrystalline silicon, which may be doped with boron, arsenic or phosphorus, as is known in the art. Over layer 212, a second layer 214 is formed of titanium silicide, tantalum silicide, cobalt silicide, nickel silicide, molybdenum silicide or tungsten silicide. At this point, a reaction barrier 218 may be formed near a first interface region 219 within the titanium (or tungsten) silicide 214 by implanting one or more active atomic species, for example, boron and nitrogen, as described above.

Figure 6:
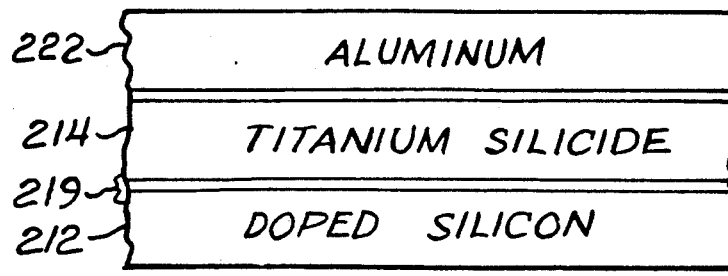
FIG. 6 is an illustration of a third specific embodiment of this invention, showing the formation of multiple barrier regions between two interfaces.

A second reaction barrier 220 may be formed on the upper surface of layer 214 by implanting one or more active atomic species, for example, boron and nitrogen, at very low energies so that the implanted species is implanted within approximately 0.03 to 0.08 microns of the top surface of the titanium silicide layer 214. The structure thus created may then be annealed in a nitrogen-containing atmosphere to create further compounds at the barrier regions as described above. A metal layer such as aluminum 222 may then be deposited on top of the structure as shown in FIG. 6 by any method as is known the art. Annealing the structure prior to the deposition of the top surface metal prevents the problems associated with over-annealing a metal, as is known in this art.

Alternatively, reaction barrier layer 220 of FIG. 6 may be formed after aluminum layer 222 has been deposited. In this alternative embodiment, boron may be implanted at a sufficiently high energy to place the maximum boron concentration within 0.01 to 0.08 microns of the top surface of the titanium silicide layer 214. After the boron implant, a second atomic species may be implanted at an energy sufficient to place the maximum concentration of the second atomic species within 0.01 to 0.08 microns of the top surface of the titanium silicide layer 214. Subsequent to the implants which form layer 220, the structure thus formed may be annealed in a nitrogen-containing atmosphere at approximately 400° to 500° C.

While this invention has been described in relation to the boundaries between a doped substrate or other layer and a metallic silicide upper layer, it should be understood that reaction barriers can be formed according to the method of this invention between many different types of layers in a multilayer integrated circuit. While the scope of this invention herein shown and described is to be considered as only illustrative, it will be apparent to those skilled in the art that numerous modifications may be made without departure from the spirit of the invention and the scope of the appended claims.

What is claimed as the invention is:

1. An integrated circuit structure including:
   a substrate doped with a first dopant,
   a metallic silicide layer located over said doped substrate, said metallic silicide layer including an interface region located adjacent to said doped substrate and formed within said metallic silicide layer, and
   a reaction barrier located within said interface region, said barrier having been formed by said interface region having been implanted with at least one ionic species effective to form said reaction barrier between the substrate and said metallic silicide layer substantially at said interface region, said reaction barrier being effective to impede migration of said first dopant through said reaction barrier.

2. The integrated circuit structure of claim 1 wherein said at least one ionic species comprises two ionic species.

3. The integrated circuit structure of claim 1 wherein said at least one ionic species is selected from the group consisting of boron ions and nitrogen ions.

4. The integrated circuit structure of claim 1 wherein said first dopant is selected from the group consisting of boron, phosphorus and arsenic.

5. The integrated circuit structure of claim 1 wherein said metallic silicide layer comprises tungsten silicide and said at least one ionic species is selected from the group comprising boron ions, nitrogen ions, or boron ions and nitrogen ions.

6. The integrated circuit structure of claim 1 wherein said metallic silicide layer comprises tantalum silicide and said at least one ionic species is selected from the group comprising boron ions, nitrogen ions, or boron ions and nitrogen ions.

7. The integrated circuit structure of claim 1 wherein said metallic silicide layer comprises cobalt silicide and said at least one ionic species is selected from the group comprising boron ions, nitrogen ions, or boron and nitrogen ions.

8. The integrated circuit structure of claim 1 wherein said metallic silicide layer comprises nickel silicide and said at least one ionic species is selected from the group comprising boron ions, nitrogen ions, or boron and nitrogen ions.

9. The integrated circuit structure of claim 1 wherein said metallic silicide layer comprises molybdenum silicide and said at least one ionic species is selected from the group comprising boron ions, nitrogen ions, or boron and nitrogen ions.

10. An integrated circuit structure including:
   a semiconductor substrate doped with a first dopant,
   a metallic silicide layer located over said substrate, said metallic silicide layer including a first interface region adjacent to said doped substrate,
   a reaction barrier located substantially within said first interface region, said first reaction barrier having been formed by implanting said first interface region with at least one ionic species, said first reaction barrier being effective to impede migration of said first dopant through said first interface region, and a metal layer located over said metallic silicide layer, said metal layer being adjacent to a second interface region within said metallic silicide layer, a second reaction barrier located substantially within said second interface region, said second reaction barrier having been formed by implanting said second interface region with at least one ionic species, so that reactions between constituents of said metallic silicide layer and constituents of said metal layer are impeded.

11. The integrated circuit structure of claim 10 wherein said at least one ionic species is selected from the group comprising boron ions and nitrogen ions.

12. The integrated circuit structure of claim 10 wherein said metal layer comprises aluminum and said at least one ionic species is selected from the group comprising boron ions, nitrogen ions, or boron and nitrogen ions.

13. The integrated circuit structure of claim 10 wherein said metallic silicide is titanium silicide and said at least one ionic species is selected from the group comprising boron ions, nitrogen ions, or boron and nitrogen ions.

14. The integrated circuit structure of claim 10 wherein said metallic silicide comprises tungsten silicide and said at least one ionic species is selected from the group comprising boron ions, nitrogen ions, or boron and nitrogen ions.

15. The integrated circuit structure of claim 10 wherein said metallic silicide comprises molybdenum silicide and said at least one ionic species is selected from the group comprising boron ions, nitrogen ions, or boron and nitrogen ions.

16. The integrated circuit structure of claim 10 wherein said metallic silicide comprises tantalum silicide and said at least one ionic species is selected from the group comprising boron ions, nitrogen ions, or boron and nitrogen ions.

17. The integrated circuit structure of claim 10 wherein said metallic silicide comprises cobalt silicide and said at least one ionic species is selected from the group comprising boron ions, nitrogen ions, or boron and nitrogen ions.

18. The integrated circuit structure of claim 10 wherein said metallic silicide comprises nickel silicide and said at least one ionic species is selected from the group comprising boron ions, nitrogen ions, or boron and nitrogen ions.

19. The integrated circuit structure of claim 10 wherein said second interface region is implanted with at least one ionic species prior to deposition of said metal layer.

20. The integrated circuit structure of claim 19 wherein said at least one ionic species is selected from the group comprising boron ions, nitrogen ions, or boron and nitrogen ions.

21. The integrated circuit structure of claim 10 wherein said second interface region is implanted with at least one ionic species after deposition of said metal layer.

22. The integrated circuit structure of claim 21 wherein said at least one ionic species is selected from the group comprising boron ions, nitrogen ions, or boron and nitrogen ions.

23. The integrated circuit structure of claim 1 wherein said reaction barrier includes the metallic ions of said metallic silicide, silicon ions, and said at least one other ionic species.

24. The structure of claim 1 wherein said reaction barrier comprises a compound of said metal of said metallic silicide, silicon, and said at least one other ionic species.

25. The structure of claim 1 wherein said reaction barrier comprises a compound of the metal of said metallic silicide, silicon and at least one of the group comprising boron and nitrogen.

26. An integrated circuit structure including:
a substrate doped with a p-type dopant,
a titanium silicide layer located over said doped substrate, said titanium silicide layer including an interface region located adjacent to said doped substrate and formed within said titanium silicide layer, and
a reaction barrier comprising a compound of titanium, silicon, boron and nitrogen located within said interface region of said titanium silicide layer, so that said p-type dopant is impeded from migration through said reaction barrier.

27. The structure of claim 26 wherein said reaction barrier comprises a compound that has been formed by implantation of ion species of boron an nitrogen into said titanium silicide layer.

28. The structure of claim 1 wherein said metallic silicide interface region lies directly upon said doped substrate.

* * * * *